United States Patent [19]
Tsao et al.

[11] Patent Number: 6,162,728
[45] Date of Patent: Dec. 19, 2000

[54] METHOD TO OPTIMIZE COPPER CHEMICAL-MECHANICAL POLISHING IN A COPPER DAMASCENE INTERCONNECT PROCESS FOR INTEGRATED CIRCUIT APPLICATIONS

[75] Inventors: Alwin J. Tsao, Garland; Paul M. Gillespie, Allen, both of Tex.

[73] Assignee: Texas Instruments Incorporated, Dallas, Tex.

[21] Appl. No.: 09/406,383

[22] Filed: Sep. 27, 1999

Related U.S. Application Data

[60] Provisional application No. 60/112,963, Dec. 18, 1998.

[51] Int. Cl.$^7$ ...................................................... H01L 21/44
[52] U.S. Cl. ......................... 438/687; 438/633; 438/637; 438/643; 438/675
[58] Field of Search ..................................... 438/687, 633, 438/637, 638, 675, 700, 622, 620, 627, 643, 618

[56] References Cited

U.S. PATENT DOCUMENTS

| | | | |
|---|---|---|---|
| 5,989,623 | 11/1999 | Chen et al. | 427/97 |
| 6,008,121 | 12/1999 | Yang et al. | 438/637 |
| 6,010,962 | 12/1999 | Liu et al. | 438/687 |

*Primary Examiner*—Charles Bowers
*Assistant Examiner*—Hsien-Ming Lee
*Attorney, Agent, or Firm*—Jacqueline J. Garner; W. James Brady III; Frederick J. Telecky, Jr.

[57] ABSTRACT

A method for forming copper interconnect lines using a damascene process. After the formation of the copper seed layer (112) and prior to the formation of the copper layer (120), a pattern (114) is formed to block the formation of the copper in non-interconnect areas. The copper layer (120) is then formed and the pattern (114) is removed. The exposed seed layer (112) and any barrier layers (110) thereunder are removed. Finally, the copper layer (120) is chemically-mechanically polished

16 Claims, 3 Drawing Sheets

METHOD TO OPTIMIZE COPPER CHEMICAL-MECHANICAL POLISHING IN A COPPER DAMASCENE INTERCONNECT PROCESS FOR INTEGRATED CIRCUIT APPLICATIONS

This application claims priority under 35 USC §119(e)(1) of provisional application No. 60/112,963 filed Dec. 18, 1998.

FIELD OF THE INVENTION

The invention is generally related to the field of copper interconnect layers for integrated circuits and more specifically to copper chemical-mechanical polishing in a copper damascene interconnect process.

BACKGROUND OF THE INVENTION

As integrated circuits become more and more dense, the width of interconnect layers that connect transistors and other devices of the integrated circuit to each other is reduced. As the width decreases, the resistance increases. Accordingly, many companies are looking to switch from a traditional aluminum interconnect to a copper interconnect. Unfortunately, copper is very difficult to etch in a semiconductor process flow. Therefore, damascene processes have been proposed to form copper interconnects.

A typical damascene process consists of forming an interlevel dielectric 12 first over a semiconductor body 10, as shown in FIG. 1A. The interlevel dielectric 12 is then patterned and etched to remove the dielectric material from the areas 14 where the interconnect lines are desired, as shown in FIG. 1B. Referring to FIG. 1C, a barrier layer 16 is then deposited over the structure including over the dielectric 12 and in the areas 14 where the dielectric has been removed. A copper seed layer 18 is then formed over the barrier layer 16. The copper layer 20 is then formed from the seed layer 18 using, for example, an electroplating process, as shown in FIG. 1D. Chemical-mechanical polishing (CMP) is then used to remove the excess copper and planarize the copper 20 with the top of the interlevel dielectric layer 12, as shown in FIG. 1E.

Unfortunately, there are several disadvantages for the current copper CMP process. CMP is a time-consuming process. Also, the copper CMP pads tend to wear out quickly. During the CMP process, erosion of the oxide of the interlevel dielectric 12 is problem as is dishing (removing more material from the center than the ends) of wide metal lines. Accordingly, there is a need for an improved method of forming copper interconnect lines.

SUMMARY OF THE INVENTION

An improved method for forming copper interconnect lines is disclosed herein. A damascene process is used. However, after the formation of the copper seed layer and prior to the formation of the copper layer, a pattern is formed to block the formation of the copper in non-interconnect areas. The copper layer is then formed and the pattern is removed. The exposed seed layer and any barrier layers thereunder are removed. Finally, the copper is CMP'd.

An advantage of the invention is providing a method for forming copper interconnects that requires less copper material to be removed during CMP thus improving cycle time and CMP pad life.

This and other advantages will be apparent to those of ordinary skill in the art having reference to the specification in conjunction with the drawings.

DETAILED DESCRIPTION OF THE EMBODIMENTS

The invention will now be described in conjunction with a damascene process for fabricating a copper interconnect layer for integrated circuit applications. The invention optimizes the copper CMP process by reducing the total amount of copper metal and/or barrier material that needs to be polished away. In addition, the invention allows the capability of removing the copper seed layer and barrier layer in non-interconnect regions, where they are not needed, prior to the copper CMP process. An addition pattern level is used to block the copper deposition in non-interconnect regions. This pattern level can be extracted from the pattern used to create the dielectric trenches of the standard copper damascene process.

A process for accomplishing an embodiment of the invention will now be described in conjunction with FIGS. 2A–2F. A semiconductor body 102 is processed through the formation of dielectric layer 104. Semiconductor devices, such as transistors, will have been formed in semiconductor body 102. The invention may be applied to the first or any subsequent metal interconnect layer. If it is the first interconnect layer, dielectric 104 is referred to as a PMD (polymetal dielectric). If is it a subsequent interconnect layer, dielectric layer 104 is referred to as an ILD (interlevel dielectric).

Dielectric layer 104 comprises any suitable dielectric material (or combination of dielectric materials) known in the art. Examples include oxides, such as silicon-dioxide, FSG (fluorine-doped silicate glass), and other low-dielectric constant materials.

Figure 1A:
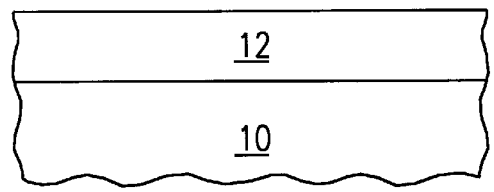
FIGS. 1A–1E are cross-sectional diagrams of a prior art copper damascene process.
Figure 1B:
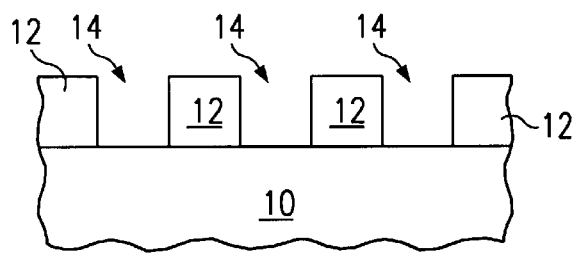
Figure 1C:
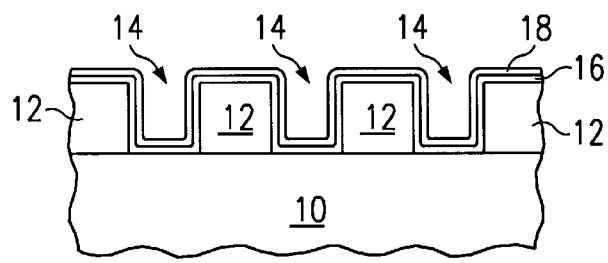
Figure 1D:
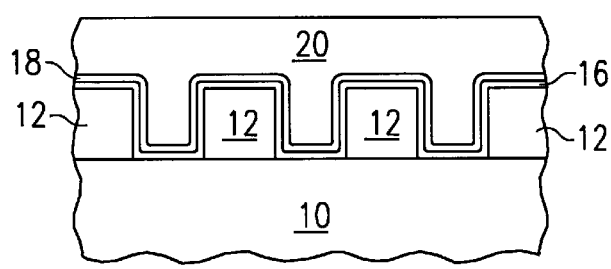
Figure 1E:
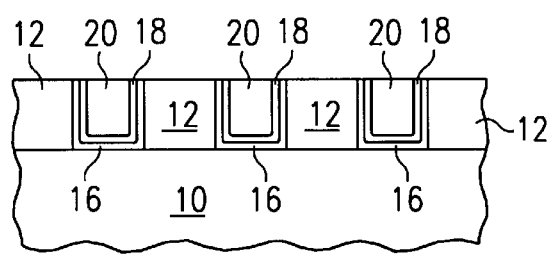
Figure 2A:
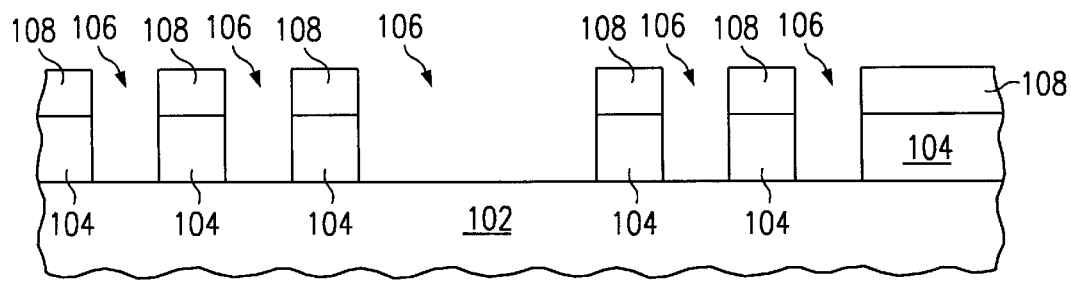
FIGS. 2A–2G are cross-sectional diagrams of a copper damascene process according to the invention, at various stages of fabrication.

Referring to FIG. 2A, trenches 106 are etched in dielectric layer 104 in areas where interconnect lines or structures are desired. This etch uses a dielectric trench pattern 108 to mask the non-interconnect areas. After the etch, the dielectric trench pattern 108 is removed.

Figure 2B:
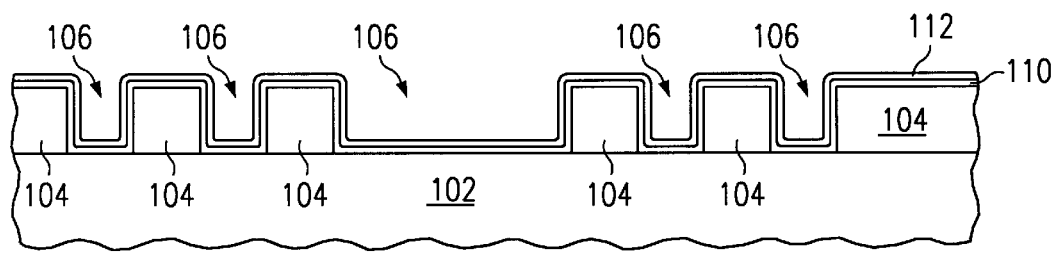
Figure 2C:
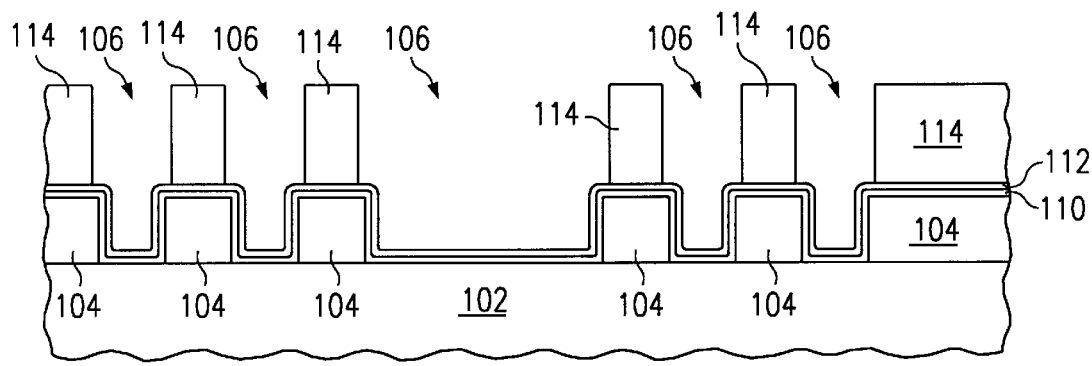

Next, one or more barrier layers 110 are deposited, as shown in FIG. 2B. Barrier materials suitable for copper are known in the art and include: Ta, TaN, $Ta_2N$, TiN, $W_2N$, and Ta—Si—N. After barrier layer 110 is deposited, a copper seed layer 112 is deposited. WE COULD INCLUDE A PREFERRED THICKNESS FOR THESE LAYERS Referring to FIG. 2C, a blocking/liftoff pattern 114 is formed over copper seed layer 112. Blocking/liftoff pattern 114 is extracted from the dielectric trench pattern 108 and preferably comprises a photosensitive material such as photoresist. Pattern 114 is used to block the subsequent copper formation in non-interconnect area. Typically, the pattern 114 is desired to cover wherever there is no dielectric trench 106. To avoid/prevent misalignment of the pattern 114 into the trench 106 area, the blocking/liftoff pattern 114 can be size adjusted, such that the pattern is pulled away from the edge of the trenches 106 as shown in FIG. 2C. In applications where the alignment capability of the steppers is relatively poor, the method can still be applied to the wider, non-minimum pitch lines (e.g., area 116).

Figure 2D:
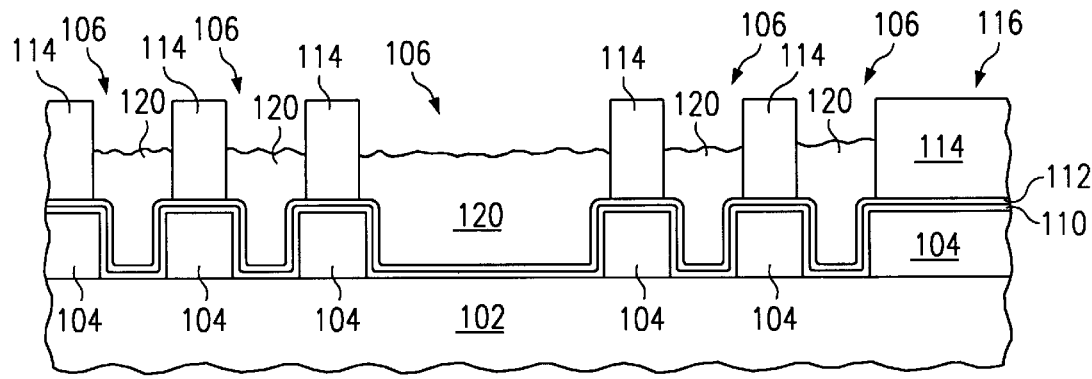

With pattern 114 in place, the copper deposition process occurs, as shown in FIG. 2D. Due to pattern 114, copper 120 is only formed in the interconnect areas. Typically, copper 120 is deposited to on the order of 0.5 μm thicker than the trench. This significantly reduces the amount of copper used and thus, the amount of excess copper that must be removed. There are several copper deposition methods known in the art. Examples include: electroplating and electroless deposition. PVD (physical vapor deposition) could also be used. However, with PVD, some copper will also be formed on blocking/liftoff pattern 114. A liftoff technique would then be used to remove the copper from on the pattern 114.

Figure 2E:
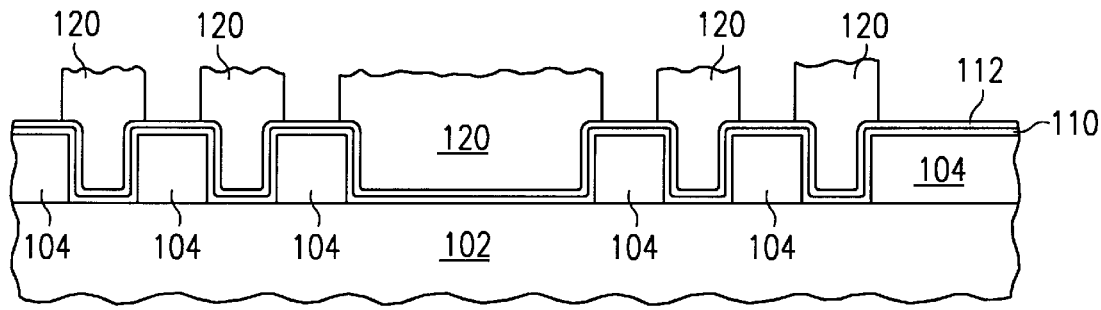

Referring to FIG. 2E, the blocking/liftoff pattern 114 is removed. The pattern can be removed by appropriate solvent cleans and/or by light plasma ash. The light plasma ash can be used because ash of "disposable" copper (copper above the dielectric layer 104) is not an issue.

Figure 2F:
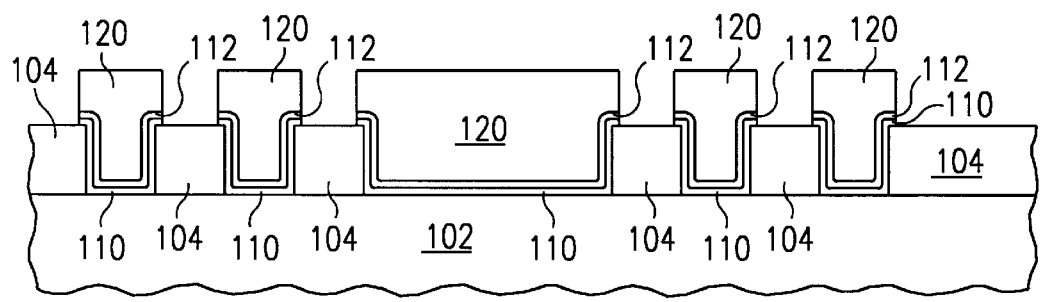

At this point, the copper 120 can be used as a mask for the removal of the copper seed layer 112 and barrier layer 110 in the non-interconnect areas, as shown in FIG. 2F. Since the "disposable" copper of copper 120 will be removed in a subsequent CMP process, it can be used as a mask to remove the thin copper seed layer 112 and the barrier layer 110. If the seed layer 112 is copper, it may be removed by a weak $HNO_3:H_2O$ mixture or by a dry plasma RIE etch. Subsequently, the barrier layer 110 may be removed by an appropriate wet etch. (TaN or $Ta_2N$ can be removed by $H_2SO_4:HF$ mixtures or Ta can be removed by $HF:H_2O$.) If other barrier materials are used, they can be removed by other appropriate etches known in the art. The barrier layer 110 material has a different selectivity to Cu CMP polish process that sometimes slows the CMP polish down. By removing the exposed portions of the barrier layer 110 prior to Cu CMP, cycle time can be improved.

Figure 2G:
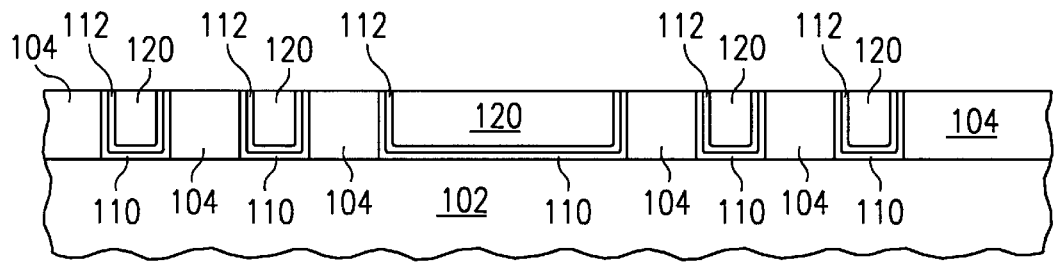

Finally, a copper CMP process is utilized as shown in FIG. 2G. The process described above is compatible with existing copper damascene processes including the post Cu-CMP process steps. However, this process significantly reduces the amount of copper that must be removed during CMP. Reducing the amount of copper to be removed reduces CMP process time and Cu CMP polishing pad wearout. Moreover, oxide erosion (of dielectric layer 104) during CMP and the amount of dishing in wide copper metal lines is also reduced.

The above process may then be repeated as necessary for subsequent metal interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming an integrated circuit, comprising the steps of:

forming a dielectric layer over a semiconductor body;

etching a plurality of trenches in said dielectric layer;

forming a barrier layer over said dielectric layer and said semiconductor body, including in said trenches;

forming a copper seed layer over said barrier layer;

after forming said copper seed layer, forming a pattern layer over said copper seed layer, said pattern layer exposing said trenches;

forming a copper layer in said trenches using said pattern layer;

removing said pattern layer; and chemically-mechanically polishing said copper layer.

2. The method of claim 1, further comprising the step of:

removing portions of said barrier layer and said copper seed layer after said step of removing said pattern layer but prior to said chemical-mechanical polish step.

3. The method of claim 2, wherein said step of removing portions of said barrier layer and said copper seed layer uses said copper layer as a mask.

4. The method of claim 2, wherein said step of forming said copper layer comprises electroplating.

5. The method of claim 4, wherein said electroplating process is adjusted such that it is diffusion limited in a tighter pitch area.

6. The method of claim 2, wherein said step of forming said copper layer comprises electroless-deposition.

7. The method of claim 6, wherein said electroless deposition is adjusted such that it is diffusion limited in a tighter pitch area.

8. The method of claim 1, wherein said step of forming said copper layer comprises physical vapor deposition.

9. The method of claim 1, wherein said pattern is extracted from a dielectric trench pattern used to etch said plurality of trenches.

10. A method for forming a copper interconnect layer on a semiconductor body, comprising the steps of:

forming a dielectric layer over said semiconductor body;

etching a plurality of trenches through said dielectric layer using a first pattern layer;

forming a barrier layer over said dielectric layer and said semiconductor body, including in said trenches;

forming a copper seed layer over said barrier layer;

forming a second pattern layer over said dielectric layer, but not over said trenches;

forming a copper layer in said trenches using said second pattern layer;

removing said second pattern layer to expose a portion of said copper seed layer;

removing said exposed portion of said copper seed layer to expose a portion of said barrier layer;

removing said exposed portion of said barrier layer; and chemically-mechanically polishing said copper layer.

11. The method of claim 10, wherein said barrier layer is selected from the group consisting of Ta, TaN, $Ta_2N$, TiN, $W_2N$, and Ta—Si—N.

12. The method of claim 10, wherein said copper layer is formed using an electroplating process.

13. The method of claim 12, wherein said electroplating process is adjusted such that it is diffusion limited in a tighter pitch region.

14. The method of claim 10, wherein said copper layer is formed using an electroless deposition process.

15. The method of claim 14, wherein said electroless deposition process is adjusted such that it is diffusion limited in tighter pitch areas.

16. The method of claim 10, wherein a shape of said second pattern layer is extract from a shape of said first pattern layer.

* * * * *